United States Patent [19]
Isomura

[11] Patent Number: 5,991,340
[45] Date of Patent: Nov. 23, 1999

[54] METHOD AND SYSTEM FOR ENCODING AND DECODING DATA USING RUN PREDICTION

[75] Inventor: Masakazu Isomura, Kawasaki, Japan

[73] Assignee: Seiko Epson Corporation, Tokyo, Japan

[21] Appl. No.: 08/880,410

[22] Filed: Jun. 23, 1997

[30] Foreign Application Priority Data

Jun. 25, 1996 [JP] Japan .................................. 8-165000

[51] Int. Cl.$^6$ .................................................. H04B 14/04
[52] U.S. Cl. ........................... 375/253; 375/240; 375/241; 375/242; 370/477; 341/51; 341/59; 341/67; 341/63
[58] Field of Search .................................. 375/240–242, 375/253; 370/477; 341/51, 59, 67, 63

[56] References Cited

U.S. PATENT DOCUMENTS

| | | | |
|---|---|---|---|
| 3,813,485 | 5/1974 | Arps | 358/261.2 |
| 5,392,037 | 2/1995 | Kato | 341/67 |
| 5,402,123 | 3/1995 | Jung | 341/63 |
| 5,533,051 | 7/1996 | James | 375/240 |
| 5,694,126 | 12/1997 | Matsushiro | 341/50 |

*Primary Examiner*—Young T. Tse
*Attorney, Agent, or Firm*—Oliff & Berridge, PLC

[57] ABSTRACT

A data encoding method having a prediction setting process that designates a numerically superior symbol as either a "0" or a "1", and the other one is designated as a numerically inferior symbol. Then a binary bit string composed of "0"s and "1"s is input, and the numerically superior symbol is predicted to continuously repeat for n symbols, where n is set as a prediction bit number. A prediction result output process outputs a prediction correct signal that is either a "0" or a "1" when a prediction is correct for the observed series. The process then moves to an operation to perform encoding of a bit series containing the next n symbols, or otherwise outputs the other signal (i.e., that is not used to represent that the prediction is correct) as a prediction failure signal. A similar prediction setting process and prediction result output process is recursively repeated by setting a new prediction bit number that is smaller than the above prediction bit number by n symbols when the prediction fails for a predetermined number of times. Further, the same prediction setting process and prediction result output process are recursively repeated using a prediction bit number changed to a new prediction bit number increased by n symbols when the prediction is correct for a predetermined number of times. Similar algorithms are applied to perform decoding.

18 Claims, 11 Drawing Sheets

COMPARISON WITH QM ENCODER
(COMPRESSION RATE/ENCODING TIME)

|        | SIZE (BYTE) | QM ENCODER   | THIS INVENTION |
|--------|-------------|--------------|----------------|
| FILE A | 13950       | 77%/6.61s    | 7.2%/2.22s     |
| FILE B | 13950       | 40.0%/6.94s  | 39.5%/2.69s    |
| FILE C | 13950       | 55.8%/7.36s  | 56.4%/2.42s    |
| FILE D | 13950       | 77.1%/7.79s  | 77.1%/3.30s    |

FIG.7

GROUP NUMBER AND ADDED BIT

| INPUT SYMBOL | GROUP NUMBER | ADDED BIT |
|---|---|---|
| 0 | 0 | 0 |
| 1 | 1 | 0 |
| 2,3 | 2 | 1 |
| 4,5,6,7 | 3 | 2 |
| 8~15 | 4 | 3 |
| 16~31 | 5 | 4 |
| 32~63 | 6 | 5 |
| 64~127 | 7 | 6 |
| 127~255 | 8 | 7 |

FIG. 11

METHOD AND SYSTEM FOR ENCODING AND DECODING DATA USING RUN PREDICTION

BACKGROUND OF THE INVENTION

1. Field of Invention

This invention relates to methods and systems for encoding and decoding data using run prediction.

2. Description of Related Art

The world of information theory that deals with binary signals is aware of arithmetic encoding methods. An arithmetic encoding method is an entropy encoding method that is intrinsically reversible (i.e., lossless). Also, arithmetic encoding is an ideal encoding method because it stores the information source. In contrast, alias encoding methods rely on non-stored information sources.

In arithmetic encoding, the stored information is divided into unequal length sections that correspond to the occurrence probability of each symbol in the data. The method assigns a symbol to each section. Sections which are able to be divided have coordinates that are acquired by repetitive recursive division and are expressed as binary numbers. The method encodes those coordinates within the corresponding section.

In comparison to encoding methods which require block encoding of specific codes and information source symbols, arithmetic encoding methods have several advantages. Such advantages include: reduced memory requirements, high efficiency encoding and the ability to easily perform adaptive encoding. An arithmetic encoding method can also compress information to a level that is nearest to the entropy of the information. Arithmetic encoding is also particularly suitable for Markov information source encoding.

Several different types of encoders have been proposed for arithmetic encoding methods. For example, a Q encoder, a MEL encoder and a Mini-Max encoder have been proposed. A QM encoder is also known as an improvement over other arithmetic encoders. QM encoders are commonly used in both color still image encoding (such as JPEG) and binary image encoding (JBIG) standards.

A QM encoder encodes binary information sources. Therefore, prior to encoding multi-level information sources, the multi-level information source requires pre-processing to make it binary. This conversion generally increases the number of symbols to be encoded. However, it is possible to convert to a binary series without increasing the amount of information.

The design of a QM encoder is explained in detail in the regulations of JPEG and JBIG. However, for the sake of comparison with the later-explained present invention, the QM encoder scheme is explained briefly using FIG. 12. An explanation of the structure of an arithmetic decoding type of entropy decoder is omitted here because it is practically identical to the structure of an entropy encoder.

The QM encoder 101 includes an arithmetic calculator 102 and a development probability generating means 103. The development probability generating means 103 functions as a state storage device. A state parameter table is written in the development probability generating means 103 to determine a symbol occurrence rate for the encoding process. The state parameters in the state parameter table are specified by the input state signals 106. The arithmetic calculator 102 outputs a readout address during the update of the calculated parameters. The development probability generating means 103 outputs state parameters to the arithmetic calculator 102 in accordance with the readout address. The arithmetic calculator 102 compresses the input data 104 into encoding data based upon the data input into the arithmetic calculator 102. Additionally, state signals 106 are input to the development probability generating means 103. The state signals 106 are used to increase the compression rate. The state signals 106 include, for example, reference pixel data such as is referenced by a Markov model.

The control routine of the QM encoder shown in FIG. 12 is described in the flowchart in FIG. 13. The flowchart of FIG. 13 starts and proceeds to step S100 where a value 0x0000 is stored in register C, a value of 0xFFFF is stored in register A and an index ST is initialized. Next, in step S101, one bit of the input data is fetched. In step S102, the control routine determines whether the input bit is a numerically superior symbol or a numerically inferior symbol. The numerically superior symbol is arbitrarily designated as either a "0" or a "1" and the numerically inferior symbol is designated as the other of a "0" or "1". When the input bit is the numerically superior symbol the control routine continues to step S103. When the input bit is a numerically inferior symbol the control routine proceeds to step S106.

The occurrence probability of a numerically inferior symbol can be obtained by referring to a probability estimate table LSZ using the index ST. The occurrence probability of the numerically superior symbol can be obtained by subtracting the probability of the numerically inferior symbol from the contents of register A.

In step S103, the occurrence probability of the numerically superior symbol is stored in register A. Then, in step S104, the control routine determines whether the highest ranking bit in register A is "1". If it is "1" then the control routine continues to step S105 and if it is "0" then the control routine jumps to step S114. In step S105, the index ST, for encoding the next symbol, is set using the probability estimate table NMPS using the index ST.

In step S106, the occurrence probability of a numerically inferior symbol is stored in register A. Then, in step S107, the value in register A is added to the value in register C and the sum is stored in register C. In step S108, the control routine determines whether the probability estimate table SWITCH outputs a "1" using the index ST. If, in step S108, the probability estimate table SWITCH outputs a "1" then the control routine continues to step S109 where the control routine changes the numerically superior symbol.

If, in step S108, the probability estimate table SWITCH does not output a "1", then the control routine jumps to step S110. In step S110, the index ST is set to the output of a probability estimate table NLPS using the index ST and the control routine continues to step S111.

In step S111, registers A and C are shifted one bit to the left. Then in step S112, the highest bit that has flowed out of register C is output as a code. The control routine then continues to step S113, where the control routine determines whether the highest bit in register A is "1". If, in step S113, the control routine determines that the highest bit in the register A is "1" then the control routine returns to step S111. If, however, the control routine determines that the highest bit in register A is not "1" then the control routine continues to step S114. In step S114, the control routine determines whether the current symbol is the last symbol in the input bit series. If in step S114, the control routine determines that the current symbol is not the last symbol in the input bit series then the control routine returns to step S101. If, in step S114 the control routine determines that the current symbol is the last symbol in the input bit series then the control routine returns control to the environment in which the control routine of FIG. 13 operates.

Thus, as shown in FIG. 13, the QM encoder 101 encodes the input bit series using probability estimate tables LSZ, NMPS and NLPS.

While the arithmetic encoding method of the QM encoder has a good encoding efficiency, the encoding speed is slow because the encoding is performed one bit at a time. In comparison, the encoding method of the Lempel-Ziv system has superior utility because the encoding speed is much faster. However, the speed benefits of the Lempel-Ziv system are significantly overshadowed by the QM encoder because the QM encoder has a much higher encoding efficiency. Conventional encoding technology does not have an encoding efficiency which is approximately as good as the arithmetic encoding method and which also has an encoding speed which is approximately as fast as the Lempel-Ziv system.

SUMMARY OF THE INVENTION

The present invention provides a method and system for encoding and decoding data that not only achieves roughly the same degree of encoding efficiency as an arithmetic encoding method but also closely approximates the encoding and decoding speed of an LZ system.

In a first exemplary embodiment of the method and system of the present invention, a prediction setting process arbitrarily designates a numerically superior symbol as either a "0" or a "1" and also designates a numerically inferior symbol as the other of a "0" or a "1". Then a bit string is input and a prediction is made that the numerically superior symbol repeats for n symbols. The n symbols is known as a prediction bit number. A prediction result output process outputs a prediction correct signal which has been arbitrarily set to either a "0" or a "1" when a prediction is correct for the n symbols. The process then moves to an operation to perform encoding of a bit series containing the next n symbols. Alternatively, the prediction result output process outputs a prediction failure symbol which is set to the other of a "0" or a "1". A similar prediction setting process and prediction result output process is recursively repeated by setting a new, smaller prediction bit number when the prediction fails for a predetermined number of times.

In this way, when a numerically superior symbol is predicted to continue for n symbols and when that prediction is successful, a bit of n units is represented by a single bit prediction success signal. Thus, a high compression efficiency and high encoding speed is achieved. When the prediction fails, the prediction bit number is decreased and the next prediction is performed. Therefore, even when a prediction fails, the compression efficiency or encoding speed is not significantly reduced.

In a first modification of the first exemplary embodiment n is set to an even number and the observed series is halved when the prediction fails for a predetermined number of times and a new prediction bit number is set to half of the previous prediction bit number when the numerically inferior symbol only exists in the first half of an observed series. The new prediction number is divided by four when the numerically inferior symbol exists in the rear half of the observed series.

Generally, when a numerically inferior symbol is present in a rear half of an observation series, it is possible to raise the encoding speed and efficiency even though there are many cases in which even more numerically inferior symbols exist in the next observation series.

In a further modification of the first exemplary embodiment, when the new prediction bit number is set to "1" and the input bit is the numerically inferior symbol, the numerically inferior symbol is changed to the numerically superior symbol and the numerically superior symbol is changed to the numerically inferior symbol and encoding continues. As a result, a preferable prediction can be made that matches the actual input data and the high encoding speed and efficiency can be preserved.

In another modification of the first exemplary embodiment, the predetermined number of times is set to "1". Therefore, the prediction bit number can be quickly reduced.

In yet another modification of the first exemplary embodiment, the prediction bit number is increased when the prediction is correct for a predetermined number of times. Therefore, to the extent that the prediction is successful, the compression efficiency is increased and the encoding speed is rapid.

A second exemplary embodiment of the data encoding method and system of the present invention provides a prediction setting process that arbitrarily designates either a "0" or "1" as a numerically superior symbol and the other of a "0" or "1" as a numerically inferior symbol when a bit string is input. The numerically superior symbol is then predicted to continuously repeat for n symbols. The n symbols is set as a prediction bit number. Then a prediction result output process outputs a prediction correct signal as either a "0" or a "1" when a prediction is correct for the observed input series. The process then continues to perform encoding of the next bit series containing the next n symbols. Alternatively, the prediction result output process outputs a prediction failure symbol as the other of a "0" or "1". This prediction setting process and prediction result output process is recursively repeated by increasing the prediction bit number by n symbols when a prediction has been correct for a predetermined number of times.

When a prediction is successful the prediction success signal of one bit representing the n units is output and the compression efficiency encoding speed is increased. Thus, to the extent that the prediction is successful, the data compression rate and encoding speed is increased.

In a modification of the second exemplary embodiment, the predetermined number of times is set to 2 and the prediction bit number is doubled. Therefore, if the prediction is successful the prediction bit number and the data compression rate is increased. Moreover, because the prediction bit number is doubled, it equals the number of bits of the numerically superior symbol that has matched and, thus, the probability is high that the next prediction will also be successful. As a result, the encoding speed and the compression rate can further be increased.

An additional modification to any one of the above data encoding methods, the n symbols are defined as $2^m$ (where m is an integer equal to or greater than 1). Therefore, in addition to being able to evenly divide the prediction bit number, when a prediction has failed, it is possible to gradually divide the prediction bit number and still arrive at a bit number of 1.

In another exemplary embodiment of the above data encoding method and system of the present invention, a front half correct process outputs "0" as a code when the front half of an observed series, which has been divided into two, is composed only of numerically superior symbols. Then, the rear half of the observed series is divided into two to output either a code "0" or "1". Then, a front half failure process outputs a "1" as a code when the numerically inferior symbol exists in the front half of the observed series. The front half of the observed series is then further divided into two and a code "0" or "1" is output. The division of the observed series is repeated as long as a numerically inferior symbol exists in each of the divided observed series and the front half correct process and the front half failure process are recursively repeated. With this exemplary embodiment, it is possible to achieve an encoding speed several times that of a QM encoder and also be able to achieve a compression rate that is similar to a QM encoder.

In yet another exemplary embodiment of the above data encoding method, a rear half correct process outputs "0" as a code when the rear half of the observed series is divided into two and is composed only of numerically superior symbols. Then the front half of the observed series is divided into two to output either a code "0" or "1". Then a rear half failure process outputs "1" as a code when the numerically inferior symbol exists in the rear half of the observed series. Then the front half of the observed series is further divided into two to output a "0" or "1" as a code. This division of the observed series is repeated as long as a numerically inferior symbol exists in each divided observed series and the rear half correct process and the rear half failure process are recursively repeated. With this exemplary embodiment, it is possible to achieve an encoding speed that is several times that of a QM encoder as well as being able to achieve a compression rate that is similar to a QM encoder.

In a further exemplary embodiment of the invention, a data encoding device has a prediction bit length calculating and setting part that arbitrarily sets either a "0" or "1" as a numerically superior symbol and the other as a numerically inferior symbol. The prediction bit length calculating and setting part also predicts that the numerically superior symbol is repeated for n symbols and sets the number n as a prediction bit number. The device also has a buffer register which temporarily memorizes the input bit series and a determining part which inputs each value of the prediction bit length calculating and setting part and the buffer register and outputs a code signal of either a "0" or "1" as a prediction correct signal when a prediction for the observed series is correct or the other of a code signal "0" or "1" as a prediction failure signal when a prediction fails.

The device decreases the prediction bit number when the prediction has failed for a predetermined number of times. The device also increases the prediction bit number when the prediction is correct for a predetermined number of times. As a result, when a prediction is successful a bit for the n units is displayed as one prediction success signal the compression encoding efficiency and speed is increased. Moreover, to the extent that predictions are successful, the prediction bit number is increased. Therefore, the compression rate is further increased. In addition, when a prediction fails the prediction bit number is decreased. Therefore, even when a prediction fails the compression rate or coding speed is not substantially decreased.

Yet another data encoding device of the present invention has a buffer register with a register group that temporarily stores an input bit series.

The device also has a prediction bit length calculating part in which a register maintains a pointer "ofs" that denotes the lead position of the observed series and another register that maintains a variable "width" that denotes the prediction bit length. The device has a determining part that selects a position indicated by "ofs" and an input bit series on the buffer register determined from "ofs" and "width" output by the prediction bit length calculator. The determining part outputs a numerically superior symbol as an encoding bit when the input bit series is composed entirely of numerically superior symbols and outputs a numerically inferior symbol when a numerically inferior symbol is included in the input bit series.

The device has an input/output control signal generator that requests the input bit when a completion signal is received from a prediction bit length calculator. The completion signal indicates that coding of the input bit series in the buffer register has been completed. The device has a stack memory for maintaining the value of the "width" variable. The device has a prediction bit length/numerically superior symbol setting part that inputs the past encoding status from the prediction length calculation part and sets the prediction bit length and numerically superior symbol of the new input bit series. When the completion signal is received from the prediction bit length calculation part, the input/output control signal generator commands the buffer register to fetch an input bit series having a number of symbols indicated by the new prediction bit length that is set by the prediction bit length/calculation symbol setting part.

In this way, the prediction bit length is changed by incrementally changing the width of the input series. Therefore, when the prediction is successful, a bit of n units is represented as a single prediction success signal and the encoding speed and compression rate is high. Moreover, to the extent that the prediction is successful and because the prediction bit number is large the compression rate is further increased. Additionally, when the prediction fails, the prediction bit number is decreased. Therefore, even if a prediction fails the compression rate and encoding speed are not substantially decreased.

In another exemplary data encoding method of the present invention, encoded data is input and decoded into bit strings. The method has an input process that defines the numerically superior symbol as either a "0" or a "1" and the other as a numerically inferior symbol. The method then inputs the prediction result of the prediction that the numerically superior symbol would continue for n symbols as a code. When a prediction has continued to succeed a prescribed number of times a new prediction is made that numerically superior symbols will continue for more than the n symbols.

As a result, when a prediction is successful, a numerically superior symbol of n units can be decoded as a single code word. This allows a high expansion rate and a rapid decoding speed. Also, to the extent that predictions are successful, the number of numerically superior symbols that are able to be decoded as a single word increases, thereby, allowing an even higher expansion rate and a more rapid decoding speed.

In yet another exemplary data decoding method of the present invention, encoded data is input and decoded into bit strings. The method has an input process that defines one of a "0" or "1" as a numerically superior symbol and the other as a numerically inferior symbol. The input process also inputs the prediction result of the prediction that the numerically superior symbol would continue for n symbols. When a prediction has continued to succeed a prescribed number of times a new prediction is made that the numerically superior symbols will continue for more than n symbols.

However, when predictions are successful, a numerically superior symbol of n units can be decoded as a single code word, thereby allowing a high expansion rate and a rapid decoding speed. Also, to the extent that predictions are successful a higher number of numerically superior symbols are decoded as a single code word, thereby, allowing an even higher expansion rate and a more rapid decoding speed. Also, when predictions fail, the prediction bit length is decreased and the operation is recursively repeated until the numerically inferior symbol is decoded. Therefore, data can be efficiently decoded even when a prediction fails.

In a further exemplary data decoding device of the present invention, encoded bits are input and decoded into bit strings. The device has a prediction bit length setting calculator that sets the prediction bit length n. The prediction bit length setting calculator also sets a numerically superior symbol as a "0" or a "1" and the other as the numerically inferior symbol. The device also has a decoding bit setting part that outputs decoding bits while temporarily storing the input bits as a decoding bit output permission signal. The decoding bit output permission signals are received from the prediction bit length setting calculator. If the input bits are numerically superior symbols then the prediction bit length is increased when the numerically superior symbol continues for a predetermined number of times.

As a result, when a prediction is successful a numerically superior signal representing n units can be decoded as a single code word and a high expansion rate and a rapid decoding speed is achieved. Also, to the extent that predictions are successful, more numerically superior symbols can be decoded as a single code word, and an even higher expansion rate and a more rapid decoding speed is achieved.

In yet another exemplary data decoding device of the present invention, input bits are input which represent prediction results that predicted whether symbols would continue for n symbols. The device also defines either a "0" or a "1" as a numerically superior symbol and the other as a numerically inferior symbol. The device has a prediction bit length/numerically superior symbol setting part that sets the prediction bit length and a numerically superior symbol of the input bit. This device also has a prediction bit length calculator that inputs the prediction bit length and the numerically superior symbol from the prediction bit length/ numerically superior symbol setting part along with the input bits and outputs a decoding bit output permission signal. The device further has a decoding bit setting part that inputs the decoding bit output permission signal and outputs decoding bits while temporarily maintaining the input bits in a predetermined format. The numerically superior symbol that continues for n symbols is written into the decoding bit setting part when the code that is input into the prediction bit length calculator is a prediction success value. When the input code is a prediction failure value the next code is input. When the next code bit is the prediction correct value a numerically superior symbol is written in the decoding bit setting part continuing for n–m symbols (where m is an integer more than one m smaller than n). When the bit is the prediction failure value, the next code is again input to the prediction bit length calculating part.

As a result, when a prediction is successful, a numerically superior symbol of n units can be decoded as a single code word and a high expansion rate and a rapid decoding speed is achieved. Also, to the extent that the prediction is successful, more numerically superior symbols can be decoded as a single code word and an even higher expansion rate and a more rapid decoding speed is achieved. Also when a prediction fails, the prediction bit length is decreased and the operation is recursively repeated until the numerically inferior symbol is decoded. Therefore, data can be efficiently decoded even when a prediction fails.

In a data decoding method and a data decoding device of the present invention, when a bit string is input, it is decided the numerically superior symbol will be a "0" or a "1" and it is predicted that the numerically superior symbol will continue for n units. When this prediction is successful, either a "0" or "1" is output as a code and the encoding is complete. When the prediction fails, the other of the "1" or "0" is output, the observed series is divided and the divided series is predicted and encoded by the same method. If the prediction is successful, division is not permitted. Further, the prediction bit number is changed and corresponds with the success or failure of predictions of the observation series.

Further, in an exemplary data decoding method and a data decoding device of the present invention, the converse of the algorithms previously shown for the data encoding method and data encoding device can be used for decoding.

BRIEF DESCRIPTION OF THE DRAWINGS

FIG. 7 is a table showing the compression rate efficiency and encoding time according to a data encoding method and a data encoding device of the present invention;

FIG. 11 is a table describing an example of an input symbol being divided into a plurality of groups by an algorithm of the present invention being applied to multiple value series data;

DETAILED DESCRIPTION OF PREFERRED EMBODIMENTS

Examples of the preferred embodiments of the present invention are described below, based on FIGS. 1–11.

Figure 1:
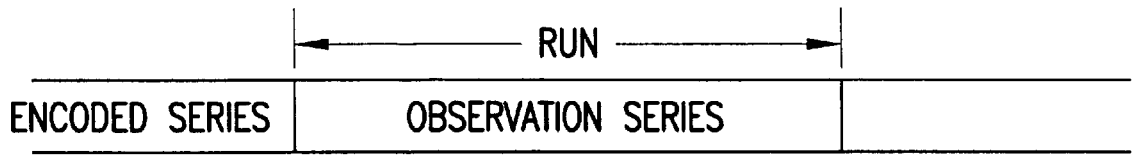
FIG. 1 is an outline of an algorithm of the present invention that shows the relationship between an observation series and a prediction bit number run.
Figure 2:
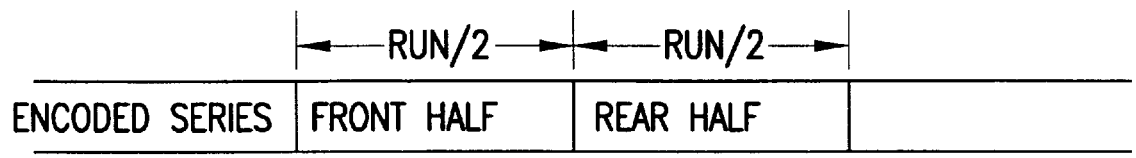
FIG. 2 is an outline of an algorithm of the present invention that shows how the observation series of FIG. 1 is divided.
Figure 3:
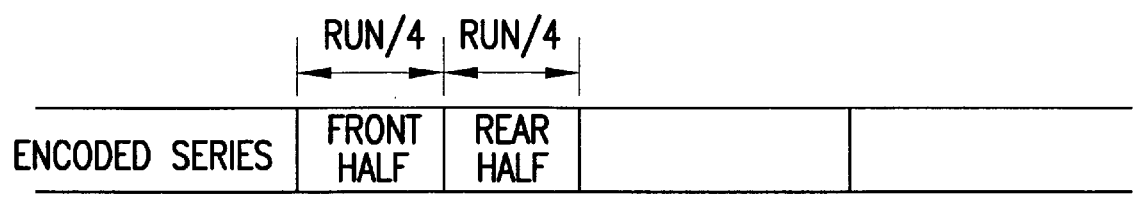
FIG. 3 is an outline of an algorithm of the present invention that shows how the front half observation series of FIG. 2 is further divided.

First, an outline of an algorithm of the present invention is described based on FIGS. 1–3. The subject of the algorithm of this invention is, in the same way as in a QM encoder, the compression of a binary bit series. First, as an initial value, either a "0" or a "1" is defined as the numerically superior symbol, and a run length is set that predicts (estimates) the repetition of that symbol. In the event that the appearance probability rate of the input series is unclear, it is acceptable to set the run length at 1. The encoding thereupon proceeds following the rules as follows. Moreover, the run length corresponds to the prediction bit number.

As shown in FIG. 1, when it is predicted that the observation series indicated as "run" is entirely of numerically superior symbols, and when the prediction is correct, a "0" is output as a code word and the coding of this observation series terminates. If the prediction fails, a "1" is output, and the following divisional coding process is executed.

If the prediction was incorrect the observation series is divided into a front half and a rear half, as shown in FIG. 2. When the front half is composed entirely of numerically superior symbols, a "0" is output as a code, and encoding of the front half terminates. When numerically inferior symbols exist in the front half, a "1" is output as a code, and the following re-dividing process is executed. If the encoding of the front half has been terminated, the observation series moves to the rear half, and encoding is performed in the same way as in the front half. A series in which numerically inferior symbols exist is divided into a potentially finite series, and the divisional encoding process described above is repeated.

The division does not necessarily have to be into two equal parts. Unequal divisions, or dividing into three or more parts is also acceptable. Further, it is acceptable to output the superior symbol, rather than "0", when the prediction is correct, or to output the inferior symbol, rather than "1", when the prediction has been incorrect. It is also acceptable to output "1" when the prediction is correct and "0" when the prediction is incorrect.

The basic algorithm of data encoding of this invention is described above. However, following a change in the appearance probability rate of the input series, it is acceptable to add the following processing to improve encoding efficiency. That is, if the series predicted by the run length continues for a prescribed number of times, for example, when it is 2 times, the run length can be doubled. Moreover, when the prediction is correct and it continues, it is also acceptable for the run length to be increased. Further, when numerically inferior symbols exist in the rear half, it is also acceptable to divide the run length by four. This is because, when numerically inferior symbols exist in the rear half, the determination is made that many numerically inferior symbols are more likely included in the succeeding series. Therefore, when numerically inferior symbols exist only in the front half, the run length can be higher than when numerically inferior symbols exist in the rear half For example, it is acceptable to divide the run length by 2. Also, when the run length is 1, and if "1" is the numerically inferior symbol, the remainder of the input series is switched. That is, the numerically superior symbol is switched.

Figure 4:
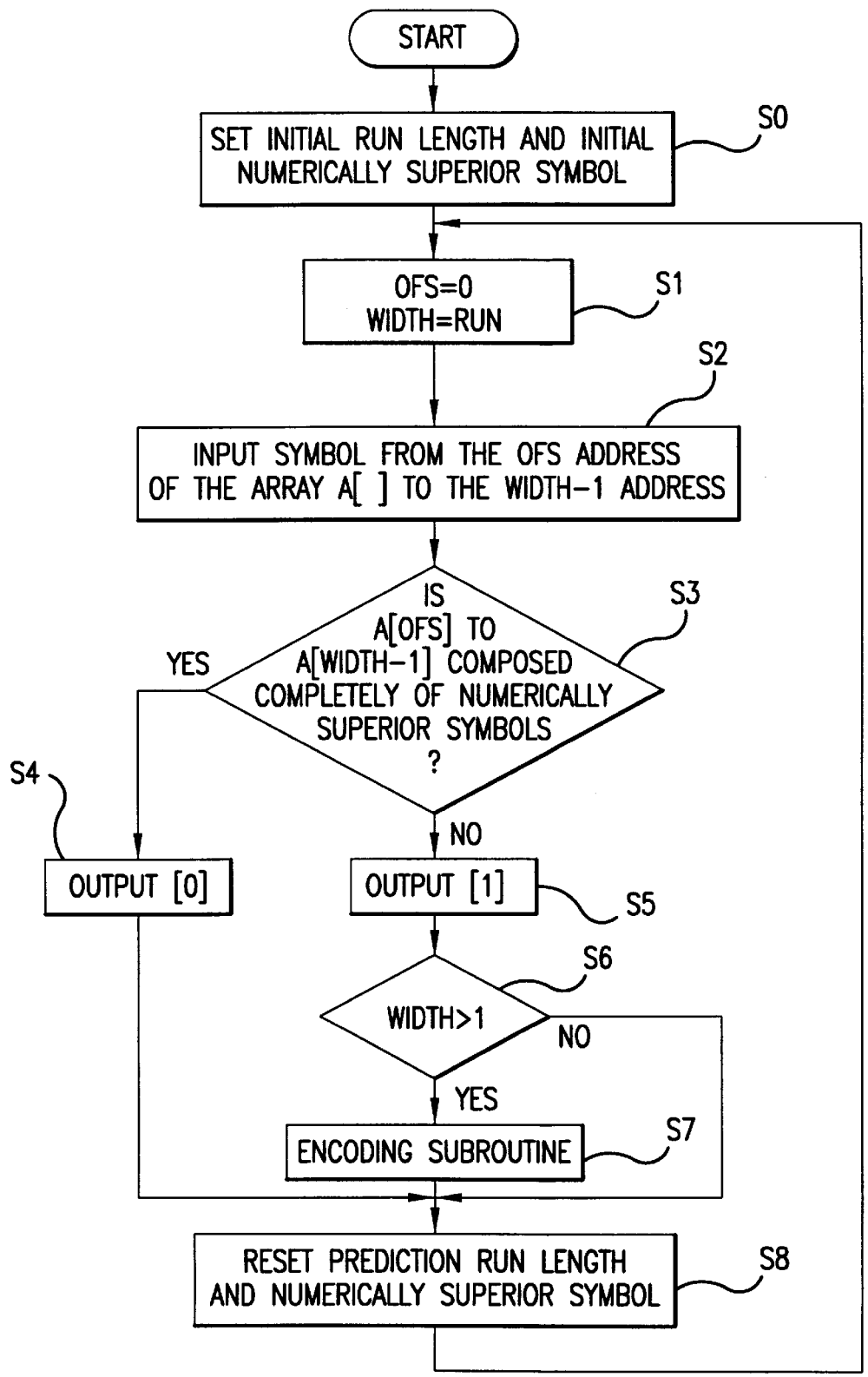
FIG. 4 is a flow chart showing the main encoding routine of the present invention.
Figure 5:
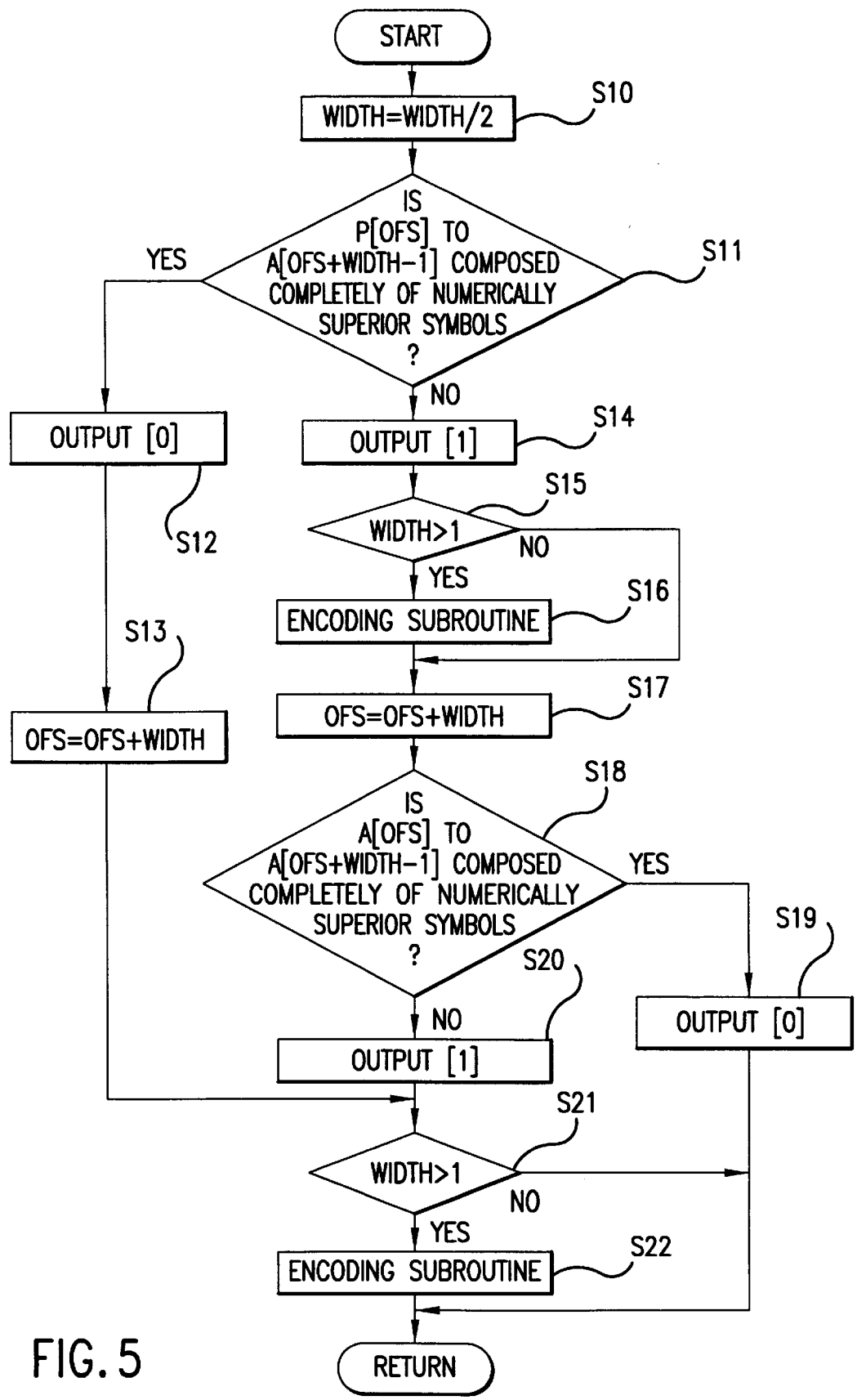
FIG. 5 is a flow chart showing the encoding subroutine of the present invention.
Figure 6:
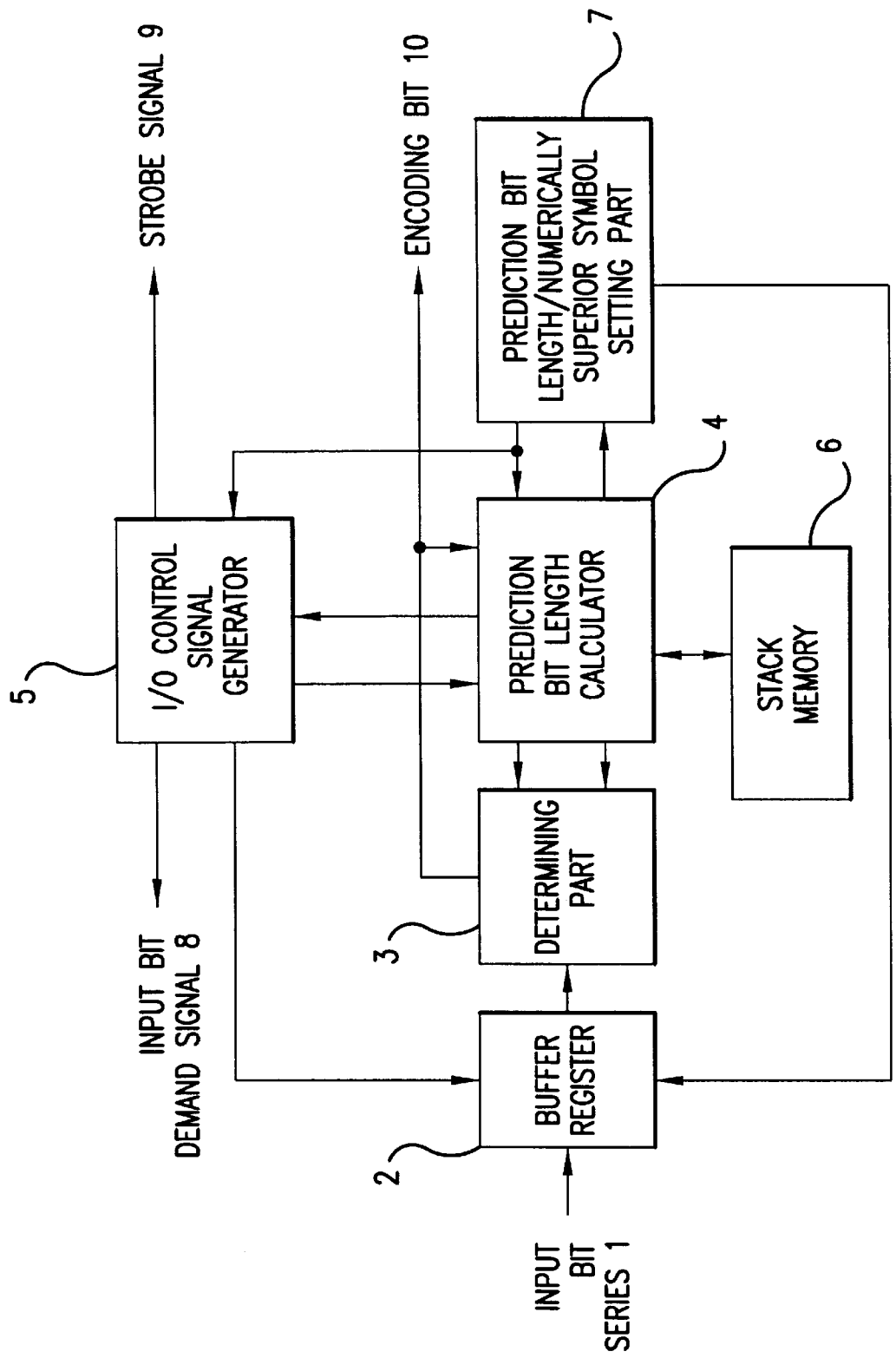
FIG. 6 is a block diagram showing a preferred embodiment of the data encoding device of the present invention.

The encoding process in the present invention is composed of a main encoding routine shown in FIG. 4 and the encoding is subroutine shown in FIG. 5. Moreover, the encoding subroutine in FIG. 5 performs the so-called function recurrent readout, in which the same subroutine is called out within the subroutine.

First, each step in the main encoding routine in FIG. 4 is explained. The subject of the encoding is the input series composed of a binary bit series. At the beginning, when the initial run length for the prediction is set, the selection of the numerically superior symbol ("0" or "1") is performed in step SO. Next, 0 is input to the local variable ofs, and the run length is substituted for the width in step S1. The variable ofs is a pointer for the series A predefined for encoding and the prediction starting bit. Accordingly, the initial value of the variable ofs becomes 0. The width is a value indicating how many bits have been defined as the subject of the prediction, from the bit position indicated by the variable ofs, to where the initial value of the prediction, run, is input. After that, input bit(s) are written from A[ofs] of the predefined series A to A[width-1] in step S2. When all of the elements from A[ofs] to A [width-1] are numerically superior symbols, it proceeds to step S4. When even one numerically inferior symbol is included, it proceeds to step S5.

When the prediction is correct, the prediction-correct signal "0" is output, and the encoding of the series taken into series A is completed in step S4. When the prediction is incorrect, a prediction failure signal "1" is output in step S5. Also, whether the width is greater than "1" is detected in step S6. If the width is equal to or less than 1, it cannot be further divided. Therefore, it moves to step S8 without moving to the encoding subroutine in step S7. On the other hand, when the width exceeds 1, the encoding subroutine in FIG. 5 is called out in step S7.

In step S8, the prediction run length is reset, and the numerically superior symbol is changed if necessary. That is, in step S8, when the prediction is basically correct, the run length is increased, and if it fails, it is decreased. Also, if the prediction continues to fail for a prescribed number of times, even if the run length is decreased, the numerically superior symbol is changed.

Various methods can be employed to evaluate whether the prediction has been correct or whether the prediction has failed. For example, a method can be employed in which the run length is immediately decreased if the prediction has failed, or in which the run length is decreased when it has consecutively failed equal to or greater than 2 times. Furthermore, a method can also be employed in which the degree of the compression of the run length can be changed only when the front half or the rear half prediction has failed. Further, a method can also be employed, for example, in which a desired probability table is created from an already encoded bit series, and the next prediction run length is set.

When the first prediction in the main encoding routine has failed, the encoding subroutine shown in FIG. 5 is called out in step S7. The variables ofs and width are carried to the encoding subroutine. Each of the steps in the encoding subroutine is explained below.

In the encoding subroutine, the prediction range is halved by dividing the original prediction range into front and rear halves in step S10. That is, width input from the parent routine of FIG. 4, is halved. Then, in the next step S11, whether the front half (the arrangement from A [ofs] to A [ofs+width-1]) is completely composed of numerically superior symbols is determined. If it is completely composed of numerically superior symbols, it proceeds to step S12. If even one numerically inferior symbol exists, it proceeds immediately to step S14.

If the front half is composed completely of numerically superior symbols, "0" is output in step S12. Also, the width is added to the pointer ofs, that indicated the lead position of the front half, so that the lead position of the rear half is now indicated. Further, when the front half is completely composed of numerically superior symbols, numerically inferior symbols must exist in the rear half Therefore, it is not necessary to output "1" indicating that the prediction of the rear half has failed. Accordingly, step S20, which will be explained later, is skipped, and it proceeds to step S21.

When numerically inferior symbols exist in the front half "1" is output in step S14. Next, whether width exceeds "1" is determined in step S15. When width is equal to or less than 1, further division is impossible. Therefore, the callout of the child encoding subroutine in step S16 is skipped, and the process moves to step S17. However, if width is equal to or greater than 2, the series is further divided by 2, and encoding must respectively be performed to each series. The child encoding subroutine for this purpose is called out in step S16. The child encoding subroutine is completely identical to the encoding subroutine shown in FIG. 5. In short, a recurrent callout is performed of the same subroutine.

When encoding of the front half by recurrent calling out of the encoding subroutine has been completed, the width, set in step S10, is added to the pointer ofs, that indicates the lead position in the front half, so that the pointer indicates the lead position of the rear half in step S17. After that, whether the rear half (the series from A [ofs] to A [ofs+width−1] of the array A) is completely composed of numerically superior symbols is determined in step S18. If it is completely composed of numerically superior symbols, it proceeds to step S19. However, if even one numerically inferior symbol exists, it proceeds immediately to step S20. Also, if the rear half is composed entirely of numerically superior symbols, "0" is output in step S19.

When a numerically inferior symbol exists in the front half, "1" is output in step S20. Then whether the width exceeds "1" is determined in step S21. When it is equal to or less than 1, further division is impossible. Therefore, step S22, in which the child encoding subroutine is executed, is skipped, and the process returns to the main routine of FIG. 4 to encode a succeeding observation series. However, with regard to the rear half, if the width is equal to or greater than 2, the series is further divided by 2, and the resulting series are encoded. As shown in FIG. 5, the encoding subroutine and identical child encoding subroutine for that purpose are called out in step S22. The encoding of the rear half is executed by recurrent calling out of this encoding subroutine.

A specific example of the above encoding process is explained next in which the input bit string "00001001" is encoded. The initial value of the run length for the prediction is defined as 8, and "0" is defined as the numerically superior symbol.

First, in step S2 of the main encoding routine shown in FIG. 4, the input bit string is input as A [0] to A [7]. In step S3, whether all the bits from A[0] to A[7] are "0" is determined. In this case, "1" is included in the bit string. Therefore, it moves to step S5, and "1" is output. Continuing to step S6, the width is checked. Since the width is 8, it proceeds to the encoding subroutine of FIG. 5 in step S7.

In the encoding subroutine, the width is set at 4 in step S10, which is ½ of the original width of 8. Also, whether all the bits in the front half of the input string, which is from A[0] to A[3], are "0" is determined in step S11. In this case, because they are all "0" it proceeds to step S12, and "0" is output. This completes the encoding for the front half Next, step S13 is executed, and encoding of the rear half is started. However, when the front half is all "0" it is obvious that "1" is included in the rear half Accordingly, in step S21, the finite rear half, in which the width is not equal to or less than 1, is further divided, and encoding must be performed to each series. Then, the encoding subroutine is again called out as a child process in step S22. Moreover, in step S13, as has been described above, the width is added to the ofs as pre-processing for that purpose, and the ofs is set at the lead position of the rear half.

In step S22, the encoding subroutine of the child is called out with the ofs and the width as the number carried forward. First, in step S22, in which the encoding subroutine for the child process is executed, the width is further divided in half, changing it to 2, in step S10 of the encoding subroutine. In the following step S11, whether the front half, that is, A[4] and A[5], are both "0" is determined. In this case, A[4] is "1", therefore, it moves to the following step S14, and "1" is output. Also, in step S15, when it is judged that the width exceeds 1, a grandchild process is called out in step S16. In the grandchild encoding subroutine, first, the width becomes "1" in step S10. Since A[4] is "1", the process moves from step S11 to step S14, and "1" is output. In step S15, the width is equal to or less than 1. Therefore, step S16 is skipped, and the value ofs is changed to 5 in step S17. Since A[5] is "0", the processing moves from step S18 to step S19, and "0" is output.

Next, exiting from this grandchild coding subroutine, it returns to step S17 of the child encoding subroutine. Because the variable ofs of the child encoding subroutine is 4, and the width is 2, in step S17, the variable ofs is changed to 6. Accordingly, in step S18, A[6] and A[7] are checked. In this case, since A[7] is "1," it moves to step S20, and "1" is output. Also, the grandchild encoding subroutine is again called out in step S22. In the grandchild encoding subroutine, since A[6] is "0", "0" is output in the step S12. Also, because the value width is "1", step S22 is skipped, and the process returns to the child encoding subroutine.

The process that has returned to the child encoding subroutine, further returns to the main encoding routine to reset the prediction run length in step S8, and to reset the numerically superior symbol. In the case of this example, the first prediction has failed; however, the second prediction is correct for the front half Therefore, the run length is changed from 8 to 4, and the numerically superior symbol continues to be "0". Moreover, in the setting of the prediction run length, a setting is also acceptable which, for example, changes the run length when the prediction has failed two times consecutively.

By the above coding process, the input bit series "00001001" becomes "1011010". Accordingly, the 8-bit input series becomes compressed to 7 bits.

Next, a data encoding device in which the encoding process described above is performed is explained based on FIG. 6.

This data encoding device is composed mainly of a buffer register 2. The buffer register is a register group that temporarily stores an input bit series 1 corresponding to the input bits explained in FIGS. 4 and 5 based on a command from the input/output control signal generator 5. A determining part 3 inputs and compares data from the buffer register 2 and data from a prediction bit length calculator 4. The prediction bit length calculator 4 has a register A and a register B are built that store the two variables ofs and width that are explained in FIGS. 4 and 5. The input/output control signal generator 5 controls the input and output. A stack memory 6 maintains the value of the width. A prediction bit length/numerically superior symbol setting part 7 sets the run length, which becomes the prediction bit length, and the numerically superior symbol.

The buffer register 2 has the capacity at least for storing an input bit series 1 with a number of bits that corresponds to the largest prediction bit run length set by the prediction bit length/numerically superior symbol setting part 7. Further, it also has a function of inputting a reversed input bit series 1 upon a command of the prediction bit length/numerically superior symbol setting part 7.

The determing part 3 selects the input bit series 1 that is the subject for prediction from the buffer register 2, by the position ofs and the width on the buffer register 2 that is output by the prediction bit length calculator 4. Then, when these bits are all "0", "0" is output as an encoding bit at 10, that is, a code of the prediction correct signal. When "1" is included, "1" is output as a prediction failure signal.

The register A and register B, that maintain the two variables ofs and width as described above, are built into the prediction bit length calculator 4. Among these variables, the variable width is set by the bit run length for the first prediction output by the prediction bit length/numerically superior symbol setting part 7, which receives the encoding start signal input from the input/output control signal generator 5. On the other hand, the value ofs is initialized at 0.

After this initialization, the prediction bit length calculator 4 orders the determining part 3 to investigate the logic of the input bit series 1 on the buffer register 2 as determined by the variables ofs and width, and read in the determination result. When the determination result is "1", that is, when the prediction has failed, that value is written into the stack memory 6, simultaneously with the width of register B being halved. However, when the width in register B is already 1, 1 is added to the ofs of the register A, and furthermore, the value of the variable width which had just been written in is read out from the stack memory 6, and stored in register B.

When the determination result is "0", that is, when the prediction is correct, the variable ofs is added to the variable width in the register B. Furthermore, the value of the variable width, which had just been written, is read out from the stack memory 6, and is stored in register B. The process described above proceeds while the input bit series 1 is being determined in each cycle. Further, the ofs of the register A gradually becomes larger as the above-described encoding process progresses. However, when the variable ofs becomes temporarily equivalent to the prediction run length, encoding of the input bit series 1 taken into the buffer register 2 is completed. Accordingly, at this time, a signal notifying the completion of the encoding is sent to the input/output control signal generator 5. As the input/output control signal generator 5 receives the signal, it activates the input bit requesting signal 8, and simultaneously instructs a new input bit series 1 to be taken into the buffer register 2.

When the input/output control signal generator 5 is in the initial state, or receives the signal from the prediction bit length calculator 4 notifying that the encoding of the input bit series 1 in the buffer register 2 has been completed, the input/output signal generator 5 activates the input bit requesting signal 8, and commands the buffer register 2 to take in the number of bits of the input bit series 1 indicated by the prediction run length input by the prediction bit length/numerically superior symbol setting part 7. Then, when the number of the bits indicated by the prediction run length is input into the buffer register 2, an encoding start signal is output to the prediction bit length calculator 4. Further, the strobe signal 9, that becomes a synchronous signal, is activated by the input/output control signal generator 5 until the completion of encoding occurring one cycle later than that output.

The stack memory 6 is for maintaining the value of the variable width that changes time by time as was described above, and is a first-in-last-out or last-in-first-out [LIFO] memory. That is, in this memory, the very first initially written value is the very last to be output and the last written value is the very first to be output. The value of this variable width that changes time-by-time is written into this stack memory 6.

The prediction bit length/numerically superior symbol setting part 7 inputs the past encoding status (to what degree the prediction is correct, or, to what degree it has failed) from the prediction bit length calculator 4, and sets the prediction bit run length of the new input bit series 1 and the numerically superior symbol. The prediction bit run length is input to the prediction bit length calculator 4, and the numerically superior symbol setting signal is input to the buffer register 2.

The encoding process shown earlier is executed by a data encoding device of a structure described above. Also, the compression rate and encoding time of this encoding process are shown in FIG. 7. FIG. 7 shows the compression rates and the encoding time for four types of files when the encoding process of the present invention is used, as well as the compression rate and the encoding time of the conventional QM encoder as reference. An example of the present invention, as shown in FIG. 7, has a compression rate at the same level as the QM encoder, and the encoding time is greatly shortened.

Next, the decoding process of the present invention is described. The decoding process is composed of the main decoding routine shown in FIG. 8 and the decoding subroutine shown in FIG. 9. Moreover, in the decoding subroutine of FIG. 9, in the same way as in the encoding routine in FIG. 5, recurrent calling out of the same routine is performed.

Figure 8:
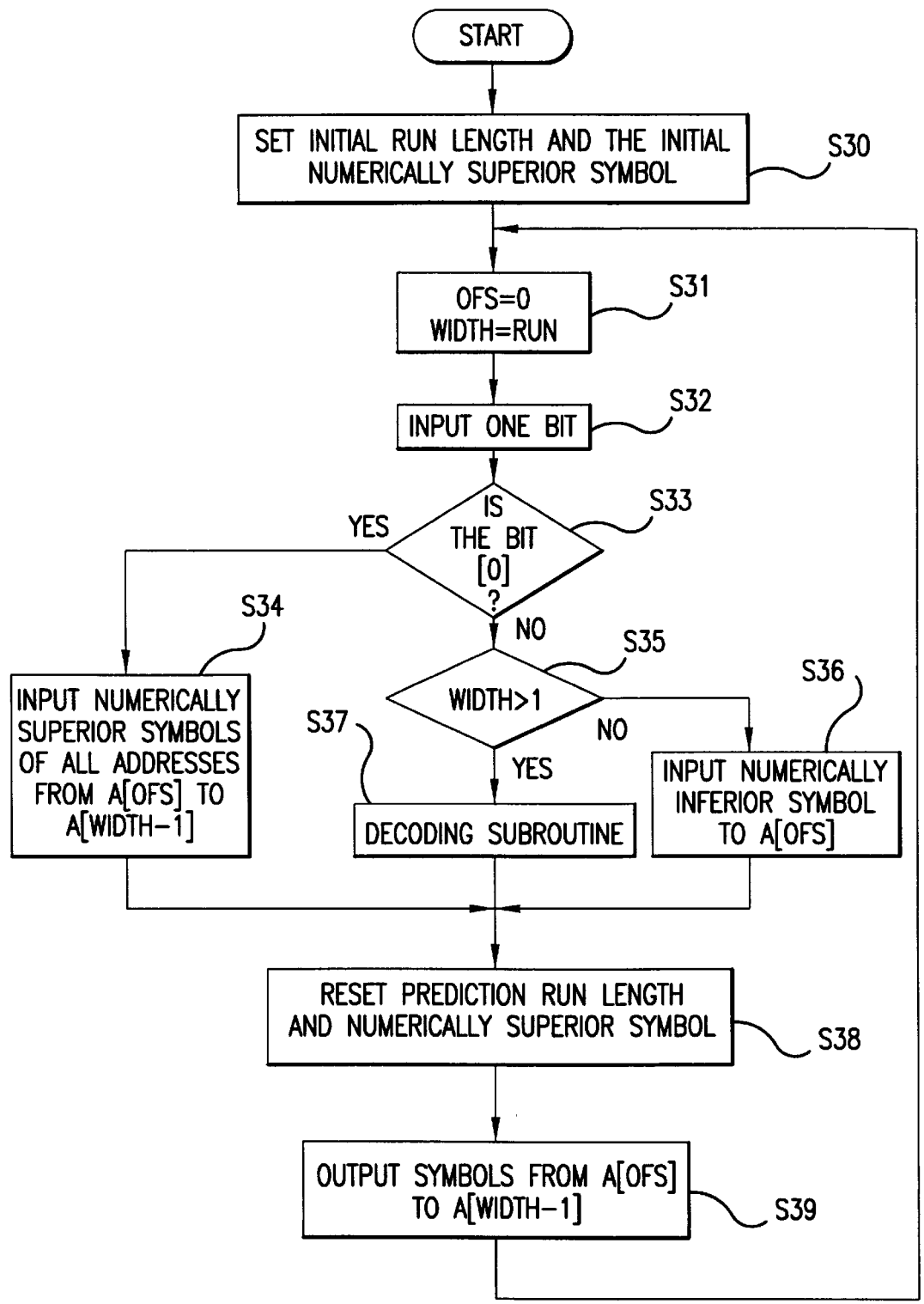
FIG. 8 is a flow chart showing the main decoding routine of the present invention.

First, each step of the main decoding routine in FIG. 8 is described. First, the setting of the initial run length for the prediction and the selection of the numerically superior symbol are performed in step S30. These values are set to the same value as the encoded side. Next, "0" is substituted for the local variable ofs, and the run length is substituted for the width in step S31. Then, 1 bit of the code, that becomes the encoded bit output 10 is input in step S32. Next, in step S33, the logic of the code is checked. If the value is "0", it moves to step S34; if the value is "1", it advances to step S35. Here, code "0" indicates a prediction correct signal showing the fact that the prediction was successful.

When the code is "0", the numerically superior symbol is written in from A[ofs] to A[width-1] in step S34. On the other hand, the code "1" shows that the prediction failed and the size of the variable width is checked. If it exceeds 1, the variable width is divided. Also, because it is capable of re-prediction, it advances to step S37, and the decoding subroutine is called out. If the variable is equal to or less than 1, it advances to step S36, and a numerically inferior symbol is written into A[ofs].

In step S38, the prediction run length is reset and, if necessary, the numerically superior symbol is changed. This resetting and changing are executed according to the same rules as in the encoding side. Following step S38, in step S39, decoding data is output from A[ofs] to A[width-1].

Figure 9:
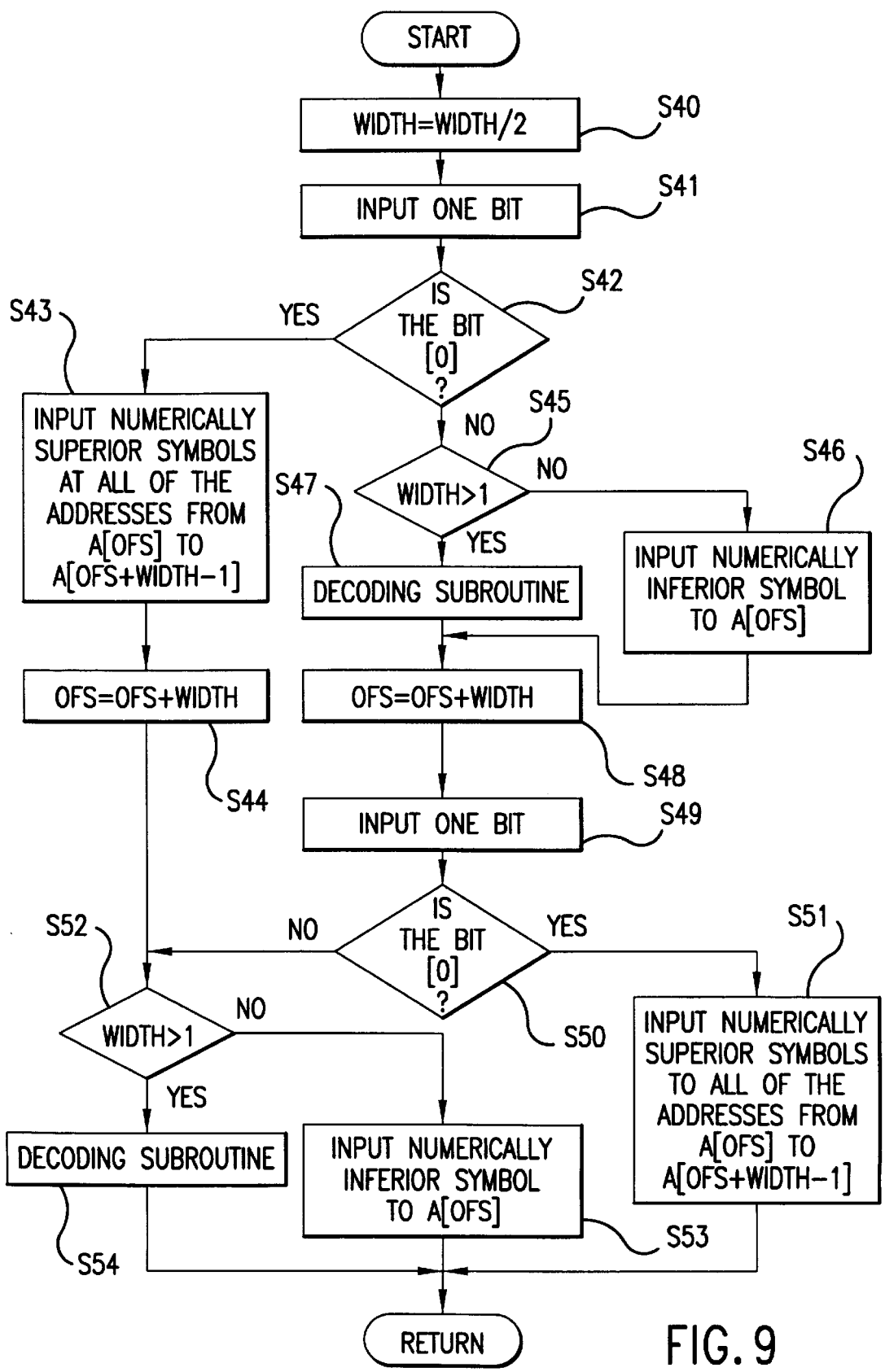
FIG. 9 is a flow chart showing the decoding subroutine of the present invention.

When the prediction has failed in the first prediction in step S33 in the main decoding routine shown in FIG. 8, the decoding subroutine of FIG. 9 is called out in step S37. The variables ofs and width are carried to this decoding subroutine. Each step of the decoding subroutine is explained below.

First, the width is divided by 2 in step S40. Next, 1 bit of the code is input in step S41. This bit is the prediction result of the front half. In the next step, S42, the logic of the input code is checked. In the case of "0" it moves to step S43, and in the case of "1", it moves to step S45. Here, the code "0" indicates that the prediction is correct. Accordingly, the numerically superior symbol is written into the front half, that is, from A[ofs] to A[ofs+width-1] in step S43. Next, in step S44, the width is added to the pointer ofs, that indicates the lead position of the front half, to indicate the lead position of the rear half. Further, when the prediction of the front half is correct, the numerically inferior symbol must necessarily exist in the rear half. Accordingly, step S49 and step S50 in which the prediction determination of the rear half is performed are skipped and it advances to step S52.

When the code is "1", it moves from step S42 to step S45, and the size of the variable width is checked. When it is equal to or less than 1, there is no need to perform any further division for prediction. That is, because the decoding bits have been defined, it moves to step S46. When they are equal to or more than 2, because further division for prediction is required, the decoding subroutine is called out in step S47. In step S46, a numerically inferior symbol is written into A[ofs]. Further, in step S47, the decoding subroutine is recurrently called out as a child process.

Step S48 is executed as continuing from step S46 or step S47. In this step S48, the variable width is added to the pointer ofs, that indicates the lead position of the front half, to indicate the lead position of the rear half. Next, 1 bit of the code is input in step S49. This bit is the prediction result of the rear half. In step S50, the logic of the input code is checked. When it is "0", it advances to step S51, and when it is "1", it advances to step S52.

Here, the code "0" indicates that the prediction is correct. Accordingly, the numerically superior symbol is input to the rear half, that is, from A[ofs] to A[ofs+width−1] in step S51. On the other hand, when the code is "1", it advances to step S52, and the size of the width is checked. When it is equal to or less than "1", further division for prediction is not required. That is, because the decoding bits have been defined, it moves to step S53, and a numerically inferior symbol is written into A[ofs]. When it is equal to or greater than 2, because further division for prediction is required, the decoding subroutine is called out as a child process in step S54.

Next, this decoding process is explained based on a specific example. That is, the decoding process is explained specifically, using the encoding bit output 10 of "1011010" obtained as the specific example for encoding described earlier. Moreover, in the same way as encoding, decoding is executed with the initial run length of the prediction being 8 and the numerically superior symbol being 0.

First, the initial encoded bit is input in step S32. Because it is "1", it advances to step S35, and the size of the width is checked. Because the width is 8, the decoding subroutine is called out in step S37. In this decoding subroutine, after the width is halved to 4 in step S40, the second bit is input in step S41. Because this is "0", it advances to step S43, and "0" is written in the front half, that is, from A[0] to A[3]. Continuing to step S44, after the variable ofs has been changed to 4, it advances from step S52 to step S54. In this step S54, the child decoding subroutine is called out as a child process.

In the child decoding subroutine, after the width is further divided by 2 in step S40, the third bit is input in step S41. Because this is "1", it passes through step S45, and a grandchild decoding subroutine is called out as a grandchild process in step S47. In this grandchild decoding subroutine, after the width is changed to 1in step S40, the fourth bit is input instep S41. Because this is "1", it advances to step S45. At this time, because the width is 1, it advances to step S46, and "1" is written into A[4] here. Continuing to step S48, after the variable ofs is changed to 5, the fifth bit is input in step S49. Because this is "0", it advances to step S51, and "0" is written into A[5].

After that, it returns to the child decoding subroutine, and the variable ofs is changed from 5 to 6 in step S48. The sixth bit is input in the next step S49. Because this is "1", it passes through step S52 and advances to step S54, in which the grandchild decoding subroutine is called out as a grandchild process. In the grandchild decoding subroutine, after the width has first been changed to 1 in step S40, the seventh bit is input in step S41. Because this bit is "0", in step S43, "0" is written into A[6]. The variable ofs is changed to 7 in the next step S44, and in step S52, because the variable width is "1", it advances to step S53, and "1" is written into A[7].

After that, it returns to the child decoding subroutine and to the decoding subroutine, and, furthermore, returns to the main decoding routine. In the main decoding routine, to which it has returned, the run length prediction and the numerically superior symbol are reset in step S38. Also, in step S39, the decoded data is output from A[0] to A[7].

The decoded data obtained according to the above decoding process is "00001001", which is the original input bit series 1.

Figure 10:
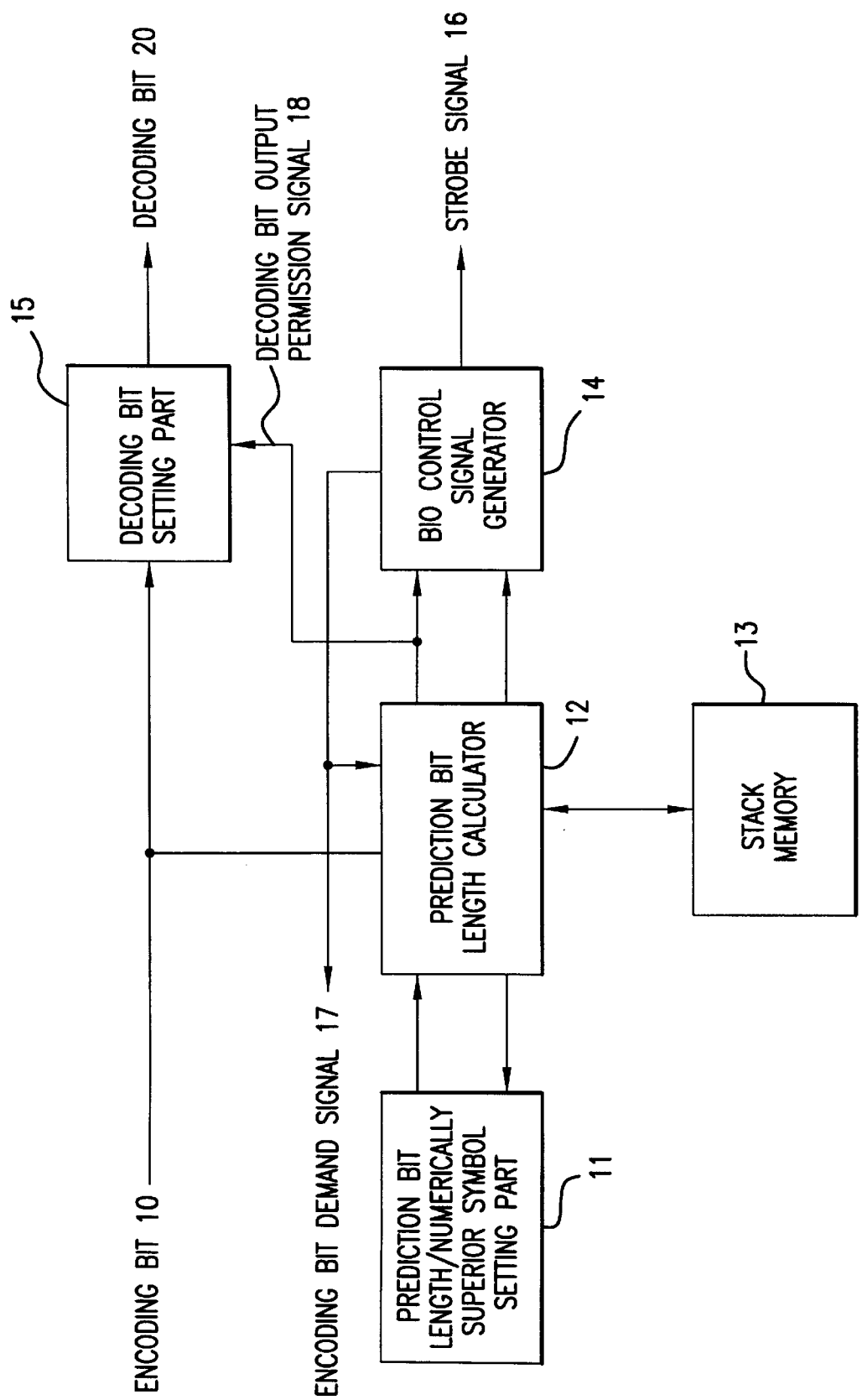
FIG. 10 is a block diagram of a preferred embodiment of the data decoding device of the present invention.
Figure 12:
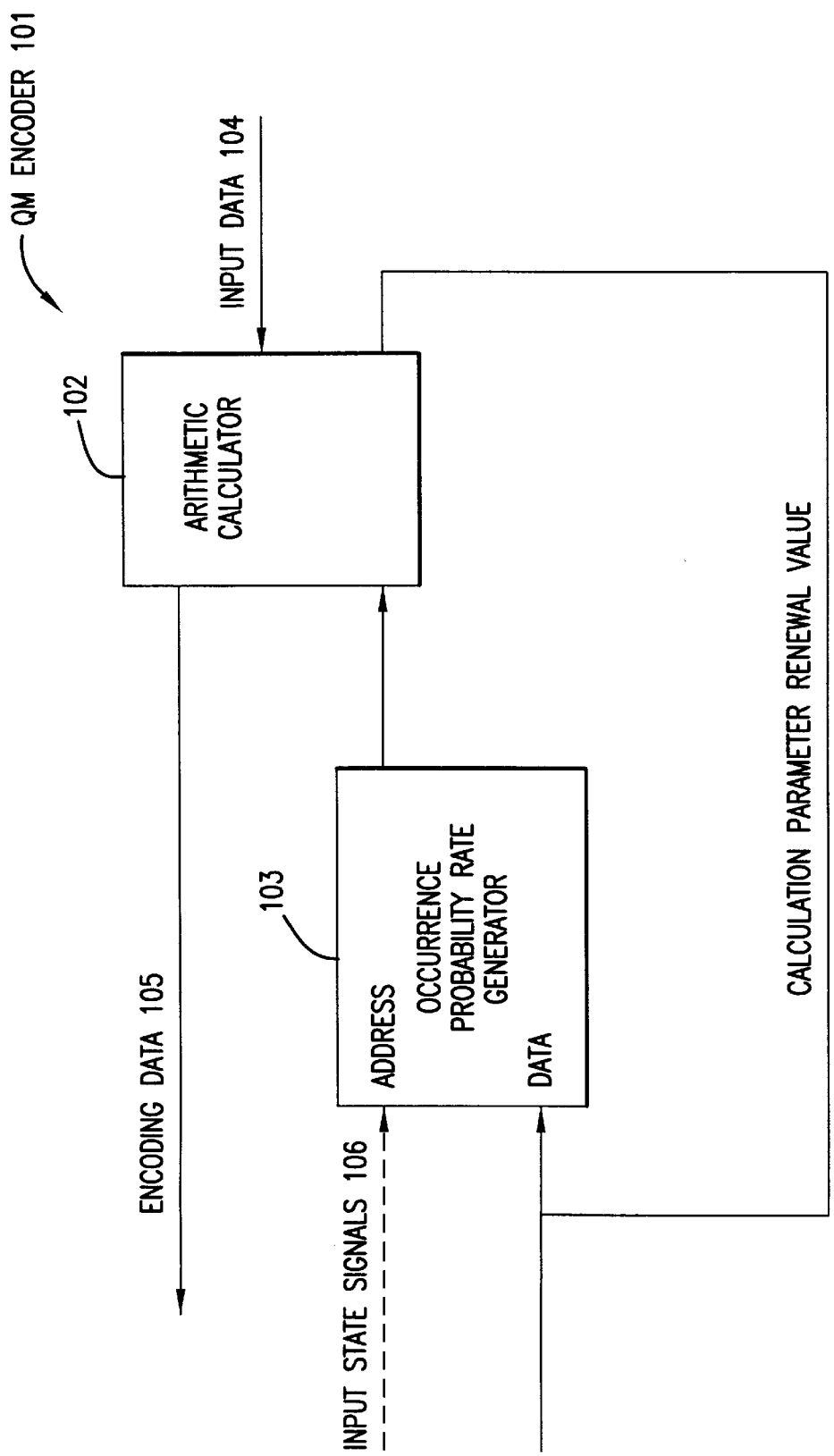
FIG. 12 is a block diagram of a QM encoder, that is a conventional arithmetic encoding type entropy encoder.
Figure 13:
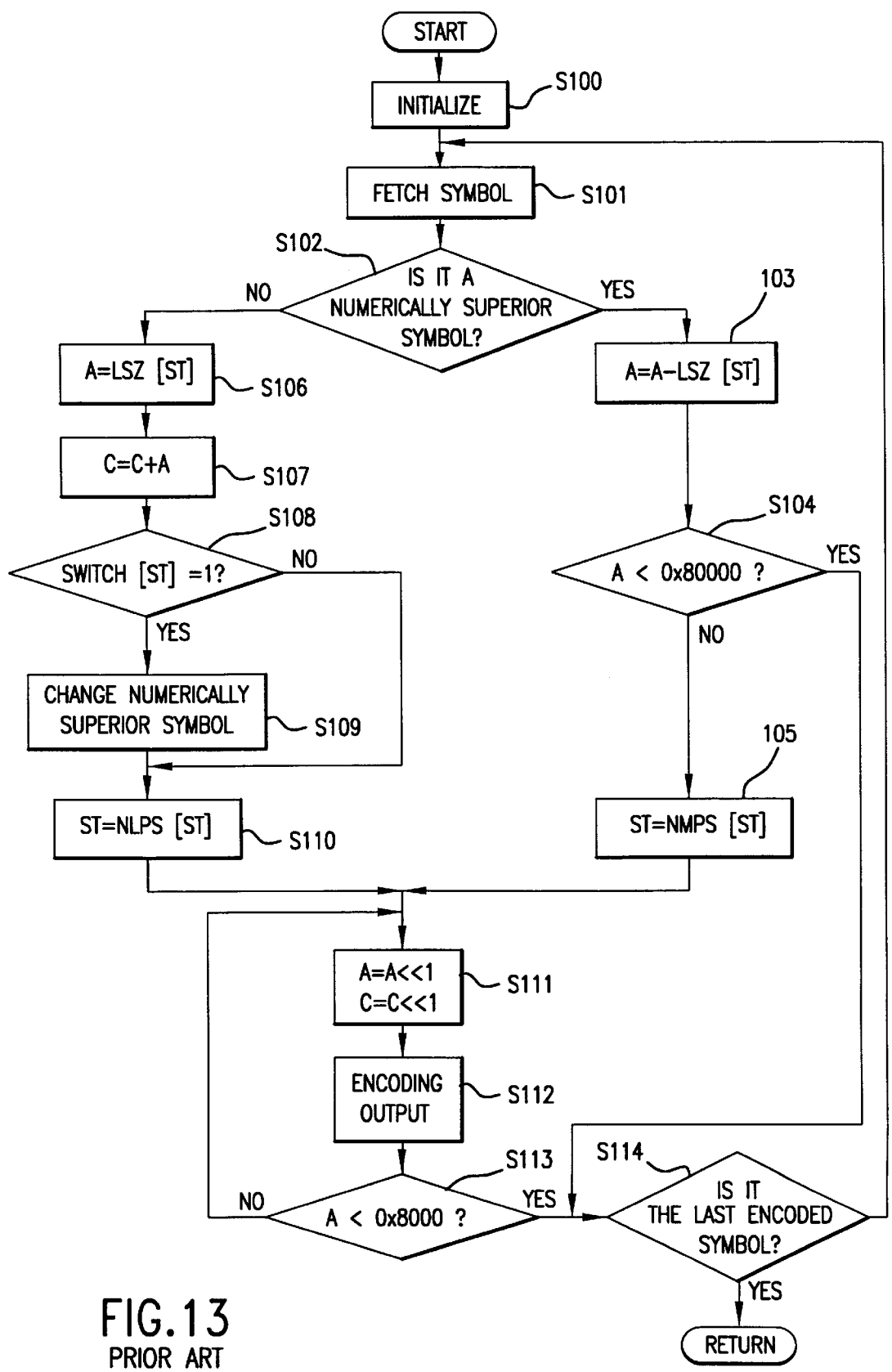
FIG. 13 is a flow chart of the operation of the QM encoder of FIG. 12.

Next, the data decoding device in which the above type of decoding process has been performed is explained based on FIG. 10.

This data decoding device is mainly composed from the prediction bit length/numerically superior symbol setting part 11 that sets the run length, which is the prediction bit length, and sets the numerically superior symbol. The prediction bit length calculator 12 has registers A and B which maintain the two variables ofs and width. A stack memory 13 maintains the values of the width that is changed time-by-time. An input/output control signal generator 14 controls the input and output, and a decoding bit setting part 15 sets the decoding bit.

Here, the prediction bit length/numerically superior symbol setting part 11 inputs the past decoding status (i.e. to what degree the prediction had been correct, or to what degree the prediction had failed) from the prediction bit length calculator 12, and sets the prediction bit run length and the numerically superior symbol of the coding bit 10 that has been newly input. The prediction bit run length is input to the prediction bit length calculator 12, and the numerically superior symbol setting signal is input to the decoding bit setting part 15.

The prediction bit length calculator 12, as described above, has registers A and B that maintain the two variables ofs and width. The variable width is set by the bit run length for the first prediction set by the prediction bit length/numerically superior symbol setting part 11, and the variable ofs is initialized at 0. The register B, that is, the value of the variable width, is supplied to the input/output control signal generator 14. On the other hand, when the input coding bit 10 is "1" and the width is equal to or greater than 2 after initialization, the variable width is halved and written into the stack memory 13. However, when the width is 1, the decoding bit output permission signal 18 is output to the decoding bit setting part 15 and the input/output control signal generator 14. Simultaneously, after adding the variable width in the register B to the variable ofs in the register A, the width, which has just been written into the stack memory 13, is read out from the stack memory 13 and maintained in register B.

Further, when the encoding bit 10 is "0", the decoding bit output permission signal 18 is output to the decoding bit setting part 15 and the input/output control signal generator 14. Simultaneously, after adding the variable width in register B to the variable ofs in register A, the width, which has just been written into the stack memory 13, is read out from the stack memory 13, and maintained in register B. The variable ofs gradually becomes larger as the decoding progresses. Then, when this variable ofs and the run length have become equal, a signal is generated indicating that the decoding of the encoding bit 10 of one prediction unit has been completed. This signal is output to the prediction bit length/numerically superior symbol setting part 11. As the prediction bit length/numerically superior symbol setting part 11 receives this signal, it performs the resetting of the prediction bit run length and the numerically superior symbol for the following encoding bit 10.

The stack memory 13 maintains the value of the width, which changes time-by-time as described above, and is a first-in, last-out or Last-in, First-out: LIFO memory. That is, this is a memory in which the value that was the very first to be written is the very last to be output. Conversely, this is a memory in which the most recent written value is the very first to be output.

The input/output control signal generator 14 is a block generating a strobe signal 16 that indicates that the effective decoding bit 20 is being output. As the decoding bit output permission signal 18 is received from the prediction bit length calculator 12, the input/output control signal generator 14 outputs strobe signal 16 for a period designated by the variable width. Further, if the strobe signal 16 is active for two cycles or more, the encoding bit request signal 17 is made inactive from the second cycle to suppress the input of the new encoding bit 10, as well as to temporarily stop the operation of the prediction bit length calculator 12.

The decoding bit setting part 15 is composed of a register that, as it receives the decoding bit output permission signal 18 from the prediction bit length calculator 12, temporarily maintains the encoding bit 10 being input. Further, the decoding bit setting part 15 reverses the decoding bit 20 if needed, based on a command of the prediction bit length/numerically superior symbol setting part 11.

The decoding process described earlier is executed by a data decoding device of the above composition. The decoding time in which this decoding process is applied, similarly to the encoding time shown in FIG. 7, is extremely shortened in comparison with the QM encoder. That is, because the decoding process uses an algorithm that is the inverse of the encoding process, if the encoding time is shortened, then the decoding time is also shortened.

Moreover, each of the embodiments described above is an example of a preferable embodiment of the present invention. However, the present invention is not limited to the above description. Within a range that does not deviate from the main point of the present invention, various altered embodiments are possible. For example, it is acceptable to have "1" instead of "0" be the output when the prediction is correct, and "0" instead of "1" when the prediction has failed, and to output a numerically superior symbol when the prediction has been correct, and output an numerically inferior symbol when the prediction has failed. Further, instead of having the new reduced prediction bit number be ½ of the original prediction bit number, it can be ⅓, ¼, or the like, and it can be a number in which a prescribed number is subtracted from the original prediction bit number. On the other hand, it is also possible, instead of making the new increased prediction bit number two times of the original prediction bit number, to make it three times, four times, or the like, and to define a number in which a prescribed number is added to the original prediction bit number, and the like. Moreover, it is also acceptable for the new increased prediction bit number not to be infinite, but to be defined as a prescribed value multiplied by 2, such as 256 bits or the like, as the largest maximum value. Further, it is acceptable, instead of having 1 as the smallest value of the new reduced prediction bit number, to have 2, 3, or another numerical value.

Further, within the divisional coding process, instead of dividing into 2, it is acceptable to have a third division, fourth division, or the like, and to divide the front half and the rear half unequally. Furthermore, instead of performing recurrent repetition of dividing until the number of bits becomes 1, when the prediction has failed, it is also acceptable if the number of bits reaches a certain number such as two or three. After that, the input bit series 1 can be output as is, or encoded by the QM encoder.

Furthermore, in the embodiments described above, when the prediction has failed, observation of the front half and encoding of the front half is performed first. Next, encoding of the rear half is performed. However, it is also acceptable to first perform encoding or decoding of the rear half first. That is, it is also acceptable to perform encoding and decoding of the rear half by giving it complete priority. Further, it is also acceptable to perform encoding and decoding making the priority part the front half, the rear half, or an appropriate mixture.

Furthermore, in the embodiments described above, the observation series, fixed by the prediction bit number run length, is predicted wholly with numerically superior symbols. When the prediction is correct, "0" or the like are output as a code, and when it has failed, in conjunction with outputting "1" and the like, the series is further divided into 2. Then, the operation is performed in the same way until the prediction has been correct or until division is impossible, to perform the encoding. However, when the prediction bit number is relatively short, for example, such as 1, 2, 4, 8, it is also acceptable to prepare a coding table in advance, and to perform encoding for one cycle by referring to that table. For example, when the prediction bit number is 2, and when the numerically superior symbol was defined as "0", if the input bit series 1 is "00", the coding bit 10 becomes "0", and if it is "01", it becomes "10". Moreover, if it is "10", it becomes "110", and if it is "11", it becomes "111". Therefore, the purpose of the coding table is to prepare this relationship in advance. By mixing in this kind of method, it is possible to further shorten the encoding time. In this case, if the encoding table is selected by the prediction bit number run to perform encoding, in the same way, the coding bit 10 similar to the one described in the embodiment above can be obtained. Further, in the same way in decoding as well, a decoding table is prepared, and by referring to the table selected by the prediction bit number run, it is possible to perform decoding in which the decoding time is shortened.

Further, the present invention can also be called a prediction run length encoding method. This prediction nin length encoding method can also be applied to a multiple value series, besides binary series data. That is, it is possible to apply the prediction run length encoding method and decoding method of the present invention, if the multiple series data is treated as a binary bit array (or string). For example, it is also acceptable to divide the series into bit planes to encode each bit plane using this prediction run length encoding method. Further, it is also acceptable to perform encoding from the highest bit on each plane using this prediction run length encoding method, and to output the following lower bit into a stream directly when "1" has appeared.

Further, as a method in which this prediction run length encoding method is applied in a multiple value series, there is a method which uses a level plane instead of a bit plane, such as in a case in which the series is divided into 256 level planes if the symbol has 8 bits. For example, a method is suggested in which input symbols are divided into a group, and the group number is encoded by this prediction run length encoding method. Specifically, for example, the input symbol is divided into a group as shown in FIG. 11, and first, the determining bit showing whether the input symbol is the group number 0 or other than 0, is coded using this prediction run-length encoding method. If the input symbol is "0", encoding of this symbol is completed. However, in a case in which it is not, the determining bit showing whether the group number is 1 or other than 1, is further coded by this prediction run-length encoding method. As described, the determining bit is coded by the prediction run length encoding method until the group number has been determined, and when the determined group number is equal to or greater than 2, required added bits are directly output into a stream. This method has an improved processing speed, because encoding of the high determining bit is not performed at the time that the group number is confirmed.

As described above, the application of the present invention to a multiple value series is not limited to data encoding, but can be applied to data decoding as well, using a similar algorithm.

What is claimed is:

1. A data encoding method, comprising:
   a prediction setting process wherein one of "0" and "1" is designated as a numerically superior symbol and the other of "0" and "1" is designated as a numerically inferior symbol when a bit string composed of "0"s and "1"s is input, the numerically superior symbol being predicted to continuously repeat for n symbols, the number n being set as a prediction bit number; and
   a prediction result output process wherein a signal of one of "0" and "1" is output as a prediction correct signal when a prediction is correct for the observed series composed of n input bits and the process moves to an operation to perform encoding of a bit series containing the next n bits, or otherwise outputs a signal of the other one of "0" and "1" as a prediction failure signal;
   wherein the prediction setting process and prediction result output process are recursively repeated by setting a new prediction bit number that is smaller than the above prediction bit number when the prediction fails for a predetermined number times.

2. The data encoding method of claim 1, wherein
   said number n is even;
   said observed series is halved when said prediction fails for a predetermined number of times;
   said new prediction bit number is half of said prediction bit number when the numerically inferior symbol only exists in the first half of the observed series; and
   said new prediction bit number is ¼ of said prediction bit number when the numerically inferior symbol exists in a rear half of the observed series.

3. The data encoding method claimed in claim 1, wherein when said new prediction bit number becomes 1 and the observed bit is the numerically inferior symbol, the conventional numerically inferior symbol is changed to the numerically superior symbol, and the conventionally numerically superior symbol is changed to the numerically inferior symbol for future encoding.

4. The data encoding method claimed in claim 1 wherein said predetermined number of times is 1 time.

5. The data encoding method claimed in claim 1, wherein said prediction bit number is changed to a new prediction bit number when said prediction is correct for a predetermined number of times.

6. The data encoding method claimed in claim 5, wherein said predetermined number of times is 2 times, and wherein said new prediction bit number is twice an original prediction bit number.

7. The data encoding method of claim 1, wherein n is defined as $2^m$, where m is an integer equal to or greater than 0.

8. The data encoding method claimed in claim 7, further comprising:
   a front half correct process wherein said observed series is halved when said prediction fails; wherein "0" is output as a code when the observed series of the front half divided into two is composed of only said numerically superior symbols; wherein the observed series of the rear half is divided into two and a further code of "0" or "1" is output; and
   a front half failure process wherein "1" is output as a code when the numerically inferior symbol exists in said front half of the observed series; and wherein said front half of the observed series is further divided into two and a further code of "0" or "1" is output; as a code;
   wherein the division of the observed series is repeated as long as a numerically inferior symbol exists in each divided observed series, and wherein said front half correct process and said front half failure process are recursively repeated.

9. The data encoding method claimed in claim 7, further comprising:
   a rear half correct process wherein said observed series is halved when said prediction fails; "0" is output as a code when the rear half of the observed series divided into two is composed of only said numerically superior symbols; and
   a rear half failure process wherein "1" is output as a code when the numerically inferior symbol exists in said rear half of the observed series; and wherein said rear half of the observed series is further divided into two and a further code of "0" or "1" is output as a code;
   wherein the division of the observed series is repeated as long as a numerically inferior symbol exists in each divided observed series, and said rear half correct process and said rear half failure process are recursively repeated.

10. A data encoding method, comprising:
    a prediction setting process wherein one of "0" and "1" is designated as a numerically superior symbol and the other of "0" and "1" is designated as a numerically inferior symbol when a bit string composed of "0"s and "1"s is input, the numerically superior symbol being predicted to continuously repeat for n symbols, the number n being set as a prediction bit number; and
    a prediction result output process wherein a signal of one of "0" and "1" is output as a prediction correct signal when a prediction is correct for the observed series composed of n input bits and the process moves to an operation to perform encoding of a bit series containing the next n bits, or otherwise outputs a signal of the other one of "0" and "1" as a prediction failure signal;
    wherein the prediction setting process and prediction result output process are recursively repeated by setting said prediction bit number as a new prediction bit number increased by n symbols when the prediction has been correct for a predetermined number of times.

11. The data encoding method claimed in claim 10, wherein said predetermined number of times is 2, and wherein said new prediction bit number is twice an original prediction bit number.

12. The data encoding method of claim 6, wherein n is defined as $2^m$, where m is an integer equal to or greater than 1.

13. A data encoding device which compresses and encodes an input bit series composed of "0"s and "1"s, comprising:

a prediction bit length calculating and setting part which sets one of "0" and "1" as a numerically superior symbol and the other one of "0" and "1" as a numerically inferior symbol, predicts that the numerically superior symbol is repeated for n symbols, and sets a number n as a prediction bit number;

a buffer register which temporarily memorizes the input bit series; and a determining part which inputs each value of said prediction bit length calculating and setting part and said buffer register and outputs a code signal of one of "0" and "1" as a prediction correct signal when the prediction for the input bit series, composed of a number of bits equal to said prediction bit number, is correct, and the other one of "0" and "1" as a prediction failure signal when the prediction fails;

wherein a new decreased prediction bit number, less than an original prediction bit number is set by said prediction bit length calculating and setting part when said prediction has failed for a predetermined number of times, and a new prediction bit number equal to n symbols more than an original bit number is set by said prediction bit length calculating and setting part when said prediction has been correct for a predetermined number of times.

14. A data encoding device, comprising:

a buffer register composed of a register group that temporarily stores an input bit series;

a prediction bit length calculating part, including a register that maintains a variable ofs denoting the lead position of the coding observation series contained in the buffer register and a register that maintains a variable width denoting a prediction bit length;

a determining part that selects a position indicated by the variable ofs and the input bit series from said buffer register and starting with the position corresponding to the variable ofs and having a length of bits equal to said variable width output by the prediction bit length calculating part, said determining part outputting one numerically superior symbol as a coding bit output when that input bit series is composed entirely of numerically superior symbols and outputting one numerically inferior symbol when a numerically inferior symbol is included;

an input/output control signal generator that demands a new input bit when a completion signal is received from said prediction bit length calculating part indicating that encoding of the input bit series in said buffer register has been completed;

a stack memory for maintaining the value of said variable width; and a prediction bit length/numerically superior symbol setting part that inputs the past coding status from said prediction bit length calculating part and sets the prediction bit length and numerically superior symbol of the newly input, input bit series, wherein, when said completion signal is received from said prediction bit length calculating part, said input/output control signal generator commands said buffer register to fetch an input bit series having a number of symbols indicated by a new prediction bit length set by said prediction bit length/numerically superior symbol setting part.

15. A data decoding method that inputs encoded data and decodes it into bit strings composed of "0"s and "1"s, the method comprising:

an input process that, in conjunction with defining one of "0" and "1" as the numerically superior symbol and the other one of "0" and "1" as the numerically inferior symbol, inputs the prediction result of a prediction that the numerically superior symbol would continue for n symbols (where n is an integer greater than 1) as a code, bit by bit, represented by a bit string composed of "0"s and "1"s; wherein, in conjunction with repeating said numerically superior symbol for n symbols to decode an input encoded data series when the input code is a prediction success value, and a new prediction is made that numerically superior symbols will continue for n more symbols when the prediction has continued to succeed a prescribed number of times.

16. A data decoding method, comprising:

an input process that, in conjunction with defining one of "0" and "1" as the numerically superior symbol and the other one of "0" and "1" as the numerically inferior symbol, inputs the prediction result of a prediction that the numerically superior symbol would continue as a code for n symbols, bit by bit, wherein n is an integer greater than 1, wherein the prediction result is represented by a bit string composed of "0"s and "1"s;

a prediction result decoding process that, in conjunction with decoding said numerically superior symbol that continues for n symbols when the input code is a prediction success value, inputs the next code when the input code is a prediction failure value; and a process that repeats said numerically superior symbol for n−m symbols to decode when the value of said next code is the prediction success value, and inputs the next code again when the value is the prediction failure value, wherein said processes are recursively repeated to decode the numerically inferior symbol when the prediction fails at a time of $0<n-m\leq 1$, where m is an integer equal to or greater than 1.

17. A data decoding device that inputs encoded data bits, and decodes the encoded data into decoding bits composed of bit strings composed of "0"s and "1"s, comprising:

a prediction bit length setting calculator that sets the numerically superior symbol and the prediction bit length n of said encoded data bits, where one of "0" and "1" is defined as the numerically superior symbol and the other one of "0" and "1" as the numerically inferior symbol; and a decoding bit setting part, that outputs decoding bits, in conjunction with temporarily storing in a predetermined form the encoded data bits being input as decoding bit output permission signals received from said prediction bit length setting calculator, wherein, in the case that the encoded data bits are said numerically superior symbols, in conjunction with outputting decoding bit output permission signals from said prediction bit length setting calculator and writing said numerically superior symbols in said decoding bit setting part, the prediction bit length is changed to a number larger than n, when said numerically superior symbols continue for a predetermined number of times.

18. A data decoding device which in conjunction with defining one of "0" and "1" as the numerically superior symbol, and the other one of "0" and "1" as the numerically inferior symbol, inputs, bit by bit, encoded bits in which prediction results that predicted that a symbol would continue n symbols (where n is an integer greater than 1), is represented by a bit string composed of "0"s and "1"s, the device comprising:

a prediction bit length/numerically superior symbol setting part that sets the prediction bit length and said numerically superior symbol of said encoded bits;

a prediction bit length calculator that inputs prediction bit length and said numerically superior symbol from the prediction bit length/numerically superior symbol setting part, and said encoded bits, and outputs a decoding bit output permission signal in accordance with the value of one of said encoded bits; and a decoding bit setting part that inputs said decoding bit output permission signal and outputs decoding bits in conjunction with temporarily maintaining the encoded bits in the input in a predetermined format, wherein, said numerically superior symbol that continues for n symbols is written into said decoding bit setting part when the code input into said prediction bit length calculator is a prediction success value, and in conjunction with this, the next code bit is input when said input code is a prediction failure value, and when said next code bit input is the prediction success value, said numerically superior symbol is written in said decoding bit setting part continuing for n−m symbols, where m is an integer larger than 1 and smaller than n, and when the bit is the prediction failure value, the next code is input to the prediction bit length calculating part again.

* * * * *